US007087360B2

(12) United States Patent
Kawamura et al.

(10) Patent No.: US 7,087,360 B2
(45) Date of Patent: Aug. 8, 2006

(54) PACKAGE STRUCTURE OF PLANOGRAPHIC PRINTING PLATES AND INTERLEAF PAPER FOR PACKAGING THE SAME

(75) Inventors: Yoshitaka Kawamura, Shizuoka-ken (JP); Takayuki Usui, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 44 days.

(21) Appl. No.: 10/409,601

(22) Filed: Apr. 9, 2003

(65) Prior Publication Data

US 2003/0215741 A1 Nov. 20, 2003

(30) Foreign Application Priority Data

Apr. 9, 2002 (JP) ............................ 2002-106572

(51) Int. Cl.

*B65D 85/62* (2006.01)
*B41N 1/00* (2006.01)
*G03F 7/11* (2006.01)
*G03F 7/095* (2006.01)
*G03F 7/09* (2006.01)

(52) U.S. Cl. ................... 430/273.1; 430/302; 430/300; 162/181.6; 162/181.3; 101/453

(58) Field of Classification Search ............ 430/273.1; 162/181.6, 181.3

See application file for complete search history.

(56) References Cited

U.S. PATENT DOCUMENTS

| | | | |
|---|---|---|---|
| 4,336,093 A | 6/1982 | Kohayakawa et al. | |
| 4,403,030 A | 9/1983 | Miura et al. | |
| 4,505,778 A | 3/1985 | Robertson | |
| 5,393,337 A * | 2/1995 | Nakamura et al. | 106/238 |
| 5,695,862 A | 12/1997 | Lacz et al. | |

FOREIGN PATENT DOCUMENTS

| | | |
|---|---|---|
| EP | 0 869 395 A1 | 10/1998 |
| EP | 1 138 520 A2 | 10/2001 |
| EP | 1 138 520 A3 | 10/2001 |
| JP | 2-25845 | 1/1990 |
| JP | 3-36545 | 2/1991 |

OTHER PUBLICATIONS

Patt et al, “Paper and Pulp: 1. Pulp”, Ullmann’s Encyclopedia of Industrial Chemistry, posted online date: Jun. 15, 2000, Wiley VCH Verlag GmbH & Co. KGaA, 53 pages.*
Eichinger, “Paper and Pulp: 5.Raw Materials for stock Preparation”, Ullmann’s Encyclopedia of Industrial Chemistry,posted online date: Jun. 15, 2000, Wiley-VCH Verlag GmbH & Co. KGaA, 10 pages.*

* cited by examiner

*Primary Examiner*—Cynthia Hamilton
(74) *Attorney, Agent, or Firm*—Sughrue Mion, PLLC

(57) ABSTRACT

An object of the present invention is to provide an interleaf paper for packaging planographic printing plates and preventing breakage of the plate-making layer at the time packaging, and a planographic printing plate package structure using a plurality of the above-mentioned interleaf paper. According to the invention, the interleaf paper for packaging the planographic printing plates is an interleaf paper, which contacts a plate-making layer of a planographic printing plate when packaging the planographic printing plates, and the interleaf paper contains Mg, Al, and Si, each at 0.5% by weight or less.

7 Claims, 3 Drawing Sheets

PACKAGE STRUCTURE OF PLANOGRAPHIC PRINTING PLATES AND INTERLEAF PAPER FOR PACKAGING THE SAME

BACKGROUND OF THE INVENTION

1. Field of the Invention

The present invention relates to a package structure of planographic printing plates and an interleaf paper for packaging said plates. More specifically, the present invention relates to an interleaf paper for packaging and protecting the planographic printing plates and the plate-making layer by being contacted thereto, and also relates to a protective structure for the planographic printing plates using the packaging material.

2. Description of the Related Art

In recently developed plate-making methods, planographic printing plates, such as photosensitive and heat-sensitive printing plates, are widely used in order to facilitate automation of plate-making.

A planographic printing plate is typically produced by a procedure comprising the following steps:

applying surface treatments, such as sandblasting, anode oxidation, and silicate treatment, to a substrate that is a sheet or a coil of aluminum or an organic polymer resin or the like;

applying a surface treatment such as chemical conversion treatment, either alone or in combination;

laminating thereon a visible light-exposure type or laser-exposure type exposure layer;

optionally providing over the exposure layer an oxygen-blocking resin layer to form a plate-making layer; and then cutting into a predetermined size.

Planographic printing plates are generally packaged in a layered state, packed in a box and consigned. Therefore, at the time of packaging, the planographic printing plates and interleaf papers are usually layered alternately for the purpose of protecting the plate-making layer. Moreover, board paper for protection called 'protector board paper' is commonly disposed at (at least) one end facing in the thickness-wise direction of a package bundle formed by alternately layering the planographic printing plates and the interleaf paper. Then, the package bundle is wrapped in an interior paper.

When using the above-mentioned planographic printing plates, which are packaged by using interleaf paper and protector board paper, in an automatic plate processor or the like, since the interleaf paper and the protecting cardboard must be removed from the planographic printing plates, an automatic plate processor having an automatic plate feeding function, wherein removal of the interleaf paper and feeding of the planographic printing plates are automatically carried out, is widely used for improving the efficiency of plate-making work.

However, if the interleaf paper and the protector board paper are adhered strongly on the planographic printing plates, when using the aforementioned automatic plate processor, the Interleaf papers and the contact cardboards are supplied to the automatic plate processor without being peeled off from the planographic printing plates. Hence, problems such as stoppage of the automatic plate processor may arise.

Moreover, when removing the interleaf paper from the surface of the above-mentioned planographic printing plates and supplying the planographic printing plates to the above-mentioned automatic plate processor, the plate-making layer of the planographic printing plate and the interleaf paper rub together. This can cause the plate-making layer to adhere to the interleaf paper and separate the plate-making layer, a phenomenon also referred to as "film-peeling".

An example of a proposed interleaf paper capable of solving the above-mentioned problem is recited in Japanese Patent Application Laid-Open (JP-A) No.2-25845. This invention proposes interleaf paper made of a synthetic pulp-mixed paper, which is produced with a heating and pressuring process.

Additionally, JP-A No. 3-36545 proposes a packing structure of a photosensitive printing plate (planographic printing plate) wherein at least one of interleaf paper and protector board paper having a water content of 8% or less is used.

The above interleaf paper and protector board paper showed a sufficient effect for protecting a planographic printing plate having a visible light exposing- or laser-exposure type plate-making layer by preventing separation of plate-making layer or film-peeling.

However, the interleaf paper disclosed in JP-A No. 2-25845 has a higher material cost since the interleaf paper is made of a mixture of a wood pulp and a synthetic pulp that is expensive in itself. Furthermore, the interleaf paper is necessarily manufactured separately from a conventional paper, and therefore, manufacturing cost of the interleaf paper also rises higher.

Moreover, recently, a photo-polymerizing type planographic printing plate is becoming employed commonly as a direct plate-making planographic printing plate wherein printing image is directly on its plate-making layer by a laser beam. The photo-polymerizing type planographic printing plate has a plate-making layer having a photo-polymerizing layer and a oxygen-blocking resin layer laminated over the photo-polymerizing layer. The photo-polymerizing layer contains a radical generating agent generating a radical by a light, an alkaline soluble binder, a polyfunctional monomer and/or a prepolymer. The oxygen-blocking resin layer is for protecting the photo-polymerizing layer from oxygen in the air.

Since the radical generated from the radical generating agent contained in the photo-polymerizing layer is easily eliminated by the contact with oxygen in the air, when the oxygen-blocking resin layer is damaged, the area of the photo polymerizing layer that is under the damaged layer contacts with oxygen and looses the photo polymerizability. Therefore, even when radiated by a laser beam, the above-mentioned area won't be photo-polymerized and leads to a defect such as a void after development.

In general, the above-mentioned oxygen-blocking resin layer consists essentially of a polyvinyl alcohol and therefore, the oxygen-blocking resin layer does not always have a sufficient mechanical strength and it can be easily broken by particles such as a filler contained in an interleaf paper.

Therefore, even by using the interleaf papers proposed in the above-mentioned prior arts for packaging photo-polymerizing type planographic printing plate, it could not be prevented completely breakage or damage of the plate-making layer such as the photo-polymerizing layer and the oxygen-blocking resin layer. Thus, the generation of void cannot be prevented completely.

SUMMARY OF THE INVENTION

Accordingly, an object of the present invention is to provide an interleaf paper for packaging planographic printing plates and preventing breakage of the plate-making layer of a planographic printing plate rubbed with the interleaf paper in an automatic plate processor when the interleaf paper is used for packaging planographic printing plates, and a planographic printing plate package structure using the interleaf paper for packaging planographic printing plates.

In order to achieve the above-mentioned object, A first aspect of the invention relates to an interleaf paper for packaging planographic printing plates, said interleaf paper contacting a plate-making layer of the planographic printing plates when packed with the planographic printing plates, and wherein each content of Mg, Al, and Si is 0.5% by weight or less.

The interleaf paper for packaging planographic printing plates of the present aspect has a small content of talc, the talc being considered to cause breakage or flaw of the plate-making layer such as an oxygen-blocking resin layer and the photo-polymerizing layer. Thus, by using the interleaf paper for packaging photo-polymerizing type planographic printing plates, breakage or flaw of the oxygen-blocking resin layer can be almost completely avoided. Therefore, void generation derived from the breakage and damage can be effectively prevented.

Moreover, since the material of the interleaf paper for packaging planographic printing plates is not particularly limited as long as the Mg, Al and Si content is in the above-mentioned range, it can be produced at a low cost by use of a low cost material.

In order to achieve the above-mentioned object, a second aspect relates to an interleaf paper for packaging planographic printing plates according to the first aspect, said interleaf paper being used for packaging planographic printing plates possesing an oxygen-blocking resin layer formed on the surface of the plate-making layer.

The present aspect relates to an example the interleaf paper of the present invention applied to packaging planographic printing plates having an oxygen-blocking resin layer formed on the surface of the plate-making layer. The above-mentioned interleaf paper is used particularly preferably for packaging planographic printing plates with an oxygen-blocking layer formed on the surface thereof.

In order to achieve the above-mentioned object, a third aspect relates to an interleaf paper for packaging planographic printing plates according to the first aspect, wherein an ash content of said interleaf paper is 1.0% by weight or less.

In order to achieve the above-mentioned object, a fourth aspect relates to an interleaf paper for packaging planographic printing plates according to the second aspect, wherein an ash content of said interleaf paper is 1.0% by weight or less.

By using the interleaf paper for packaging planographic printing plates, breakage and damage of the plate-making layer can be further reduced and thus, void generation can be further effectively prevented.

In order to achieve the above-mentioned object, a fifth aspect relates to an interleaf paper for packaging planographic printing plates according to the first aspect, wherein a particle area ratio of said interleaf paper is 0.3% or less.

In order to achieve the above-mentioned object, a sixth aspect relates to an interleaf paper for packaging planographic printing plates according to the second aspect, wherein a particle area ratio of said interleaf paper is 0.3% or less.

When packaging planographic printing plates using interleaf paper containing particles of larger particle size or containing then in a higher density, breakage and damage of the plate-making layer can easily. On the contrary, since the interleaf paper for packaging planographic printing plates of the fifth or sixth aspect has a particularly small existence ratio of particles with a large particle size and a quite low particle existence density. Thus, there is neither breakage nor damage of the plate-making layer or the oxygen-blocking resin layer when using the leaf paper for packaging photo-polymerizing type planographic printing plates.

In order to achieve the object mentioned in the above, a seventh aspect relates to a planographic printing plate package structure using a plurality of the interleaf paper for packaging planographic printing plates according to the first aspect, wherein the planographic printing plates and the interleaf papers are alternately layered.

In order to achieve the object mentioned in the above, an eighth aspect relates to a planographic printing plate package structure using a plurality of the interleaf paper for packaging planographic printing plates according to the second aspect, wherein the planographic printing plates and the interleaf papers are alternately layered.

In order to achieve the object mentioned in the above, a ninth aspect relates to a planographic printing plate package structure using a plurality of the interleaf paper for packaging planographic printing plates according to the third aspect, wherein the planographic printing plates and the interleaf papers are alternately layered.

In order to achieve the object mentioned in the above, a tenth aspect relates to a planographic printing plate package structure using a plurality of the interleaf paper for packaging planographic printing plates according to the fourth aspect, wherein the planographic printing plates and the interleaf papers are alternately layered.

In order to achieve the object mentioned in the above, an eleventh aspect relates to a planographic printing plate package structure using the interleaf paper for packaging planographic printing plates according to the fifth aspect, wherein the planographic printing plates and the interleaf papers are laminated alternately.

In order to achieve the object mentioned in the above, a twelfth aspect relates to a planographic printing plate package structure using a plurality of the interleaf paper for packaging planographic printing plates according to the sixth aspect, wherein the planographic printing plates and the interleaf papers are alternately layered.

By packing planographic printing plates in the planographic printing plate package structure of the seventh to twelfth aspects, it can be effectively prevented that when separating interleaf paper from the plate-making layer of the planographic printing plates on an automatic plate processor, the surface of the plate-making layer of the planographic plates and the interleaf papers rub with each other to break or damage the plate-making layer surface.

DESCRIPTION OF THE PREFERRED EMBODIMENTS

Figure 1:
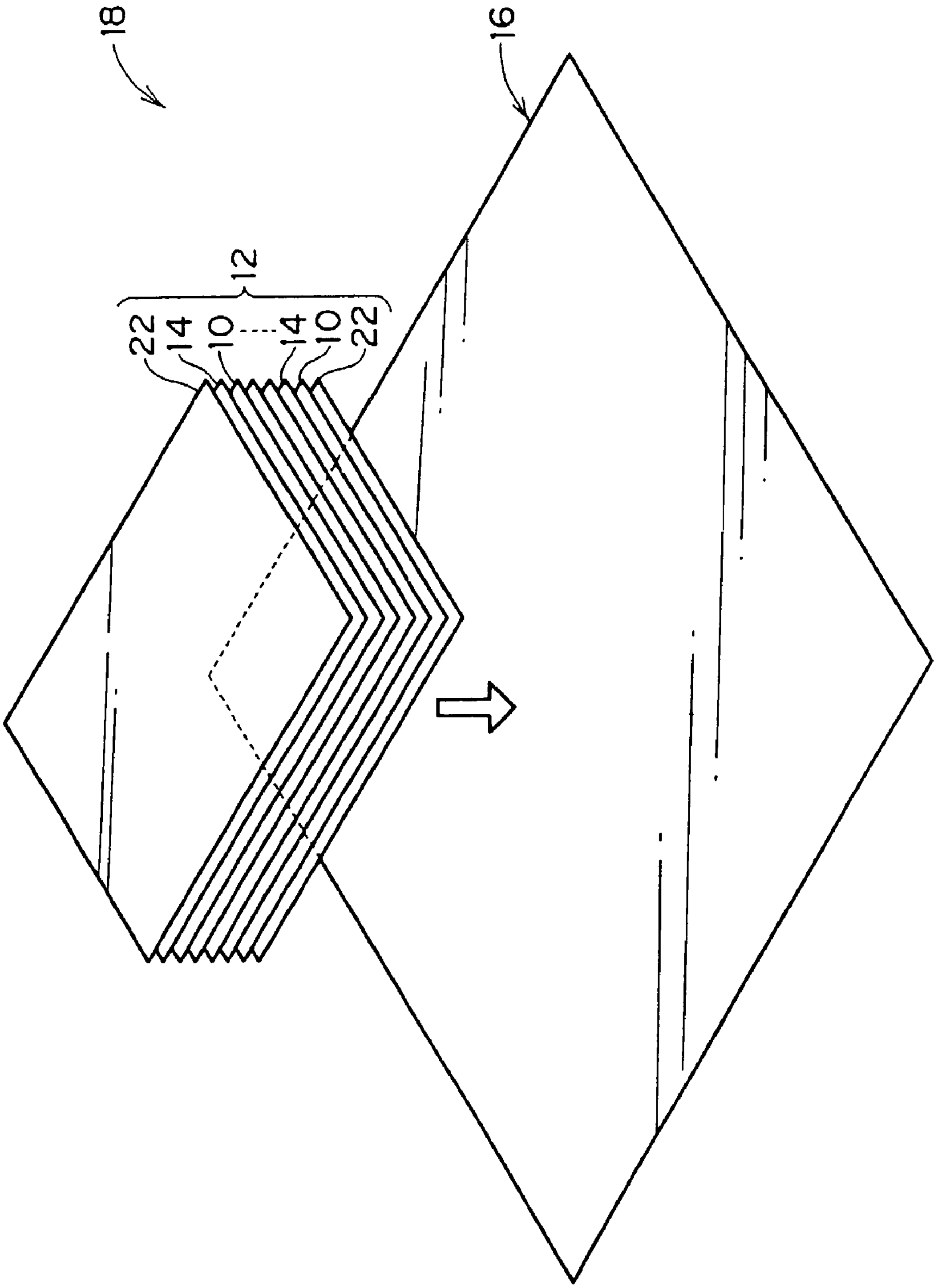
FIG. 1 is a perspective view of an embodiment of a planographic printing plate package structure of the present invention, showing the state thereof before packaging a laminated bundle of planographic printing plates and interleaf paper with an interior paper.

1. Interleaf Paper for Packaging Planographic Printing Plates

A planographic printing plate to which interleaf paper for packaging planographic printing plates of the present invention can be applied includes the above-mentioned photo-polymerizing type planographic printing plate as well as a planographic printing plate having any of embodiments (1) to (12) shown in the below:

(1) an embodiment having a plate-making layer containing an infrared ray absorbing agent, a compound of generating an acid by heat, and a compound of cross-linking by heat;

(2) an embodiment having a plate-making layer containing an infrared ray absorbing agent and a compound that becomes alkaline soluble by heat;

(3) an embodiment having a plate-making layer comprising two layers, that is, a physical development nuclei-containing layer and a silver halide emulsion layer;

(4) an embodiment having a plate-making layer including three layers, that is, a polymerizing layer containing a polyfunctional monomer and a polyfunctional binder, a layer containing a silver halide and a reducing agent, and an oxygen-blocking resin layer;

(5) an embodiment having a plate-making layer including two layers, that is, a layer containing a novolak resin and a naphthoquinone diazido, and a layer containing a silver halide;

(6) an embodiment having a plate-making layer containing an organic photo conductor;

(7) an embodiment having a plate-making layer comprising two or three layers, one of which is a laser beam absorbing layer that is to be eliminated by laser beam irradiation, the other of which is a lipophilic layer and/or a hydrophilic layer;

(8) an embodiment having a plate-making layer containing a compound generating an acid by absorbing energy (acid-generating agent), a polymer compound having a functional group in a side chain thereof, which generates a sulfonic or carboxylic acid by contact with an acid, and a compound providing energy to the acid generating agent by absorbing a visible light;

(9) an embodiment having a plate-making layer containing a quinone diazido compound and a novolak resin;

(10) an embodiment having a plate-making layer containing a compound decomposed by a light or an ultraviolet ray to form a cross-linking structure by itself or with other molecules in the layer, and an alkaline soluble binder;

(11) an embodiment having a plate-making layer comprising three layers; a lyophilise layer containing an infrared ray absorbing agent, a hydrophilic layer containing a silica, and a water soluble protection layer containing an infrared ray absorbing agent; the adhesion between the lyophilise layer and the hydrophilic layer is released by heat so as to adhere wetting water; and

(12) an embodiment having a plate-making layer comprising two layers, one of which is a photosensitive layer containing a carbon black, and the other of which is an oil repellent layer containing an organosiloxane.

The contents of Mg, Al, and Si in the above-mentioned Interleaf paper for packaging planographic printing plates are 0.5% by weight or less. In particular, it is preferable that the Mg content is 0.2% by weight or less, and the Al and Si content is 0.3% by weight or less.

As mentioned above, talc in interleaf paper is thought to relate deeply with breakage of a plate-making layer. Talc is mainly composed of magnesium silicate and contains alumina as an additional component. Thus, the above-mentioned interleaf paper for packaging planographic printing plates, which has small Mg, Al and Si contents, is considered to have a small talc content as well.

Therefore, when a plate-making layer of a planographic printing plate is rubbed rapidly by the above-mentioned interleaf paper for packaging planographic printing plate, the plate-making surface is not thought to be broken or damaged by the rub. Consequently, the interleaf paper of the present invention can be preferably used for packaging direct laser-exposure type planographic printing plates (CTP) wherein interleaf paper used for packaging is often quickly removed in the aforementioned automatic plate processor. Additionally, the interleaf paper of the present invention can be used preferably for packaging highly sensitive type planographic printing plates having an oxygen-blocking layer formed on the surface thereof such as the above-mentioned photo-polymerizing type planographic printing plate or the planographic printing plate of the above-mentioned embodiment (4).

The above-mentioned Mg, Al and Si content can be measured by fluorescent X-ray element analysis method or others. Methods for measuring Mg, Al and Si are not limited to the fluorescent X-ray element analysis method as long as the methods are a common method for quantifying inorganic elements.

The ash content of the above-mentioned interleaf paper for packaging planographic printing plates is preferably 1.0% by weight or less.

The ash content can be measured by a method such as heating the above-mentioned interleaf at a high temperature in the existence of the oxygen so as to be incinerated into ash and then, measuring the weight of the obtained ash.

An interleaf paper with the ash content in the above-mentioned range does not cause breakage or damage the plate-making layer of the planographic printing plates when being used for packaging them.

The particle area ratio in the above-mentioned interleaf paper is preferably 0.3% or less, and is particularly preferably 0.2% or less.

The above-mentioned particle area ratio can be measured by photographing an inverted electron image of the surface of the interleaf paper in a photographic film using an electron micro probe analyzer, and calculating the ratio of the area of white part to the entire area.

Further, the talc content in the above-mentioned interleaf paper for packaging planographic printing plates is preferably 0.7% by weight or less.

The above-mentioned interleaf paper for packaging planographic printing plates can be produced from a wood pulp such as a mechanical pulp, a chemical pulp, a chemi ground pulp, and a semi chemical pulp. Instead of the above-mentioned wood pulp, a non-wood pulp such as straw pulp, bamboo pulp, paper mulberry pulp, mitsumata pulp, linen pulp, cotton pulp, used paper pulp, or the like can be used as well. Furthermore, the above-mentioned interleaf paper includes a paper made of the above-mentioned wood or non-wood pulps and a synthetic pulp made from a polyethylene, a polypropylene, a polyester, or the like.

In Addition, as long as the Mg, Al and Si content does not exceed the above-mentioned range, a filler such as a sulfuric acid earth, a clay, a titanium white and a baryta can be added to the above-mentioned wood pulp, non-wood pulp and synthetic pulp.

2. Planographic Printing Plate Package Structure

A planographic printing plate package structure of the present invention includes a structure wherein the above-mentioned interleaf paper and the planographic printing plates are laminated alternately.

In the planographic printing plate package structure having the above-mentioned structure, protector board paper and interior paper are optional. Additionally, as well as a conventional corrugated cardboard box package, a skid type package structure wherein a laminated bundle of the planographic printing plates is placed on a skid and wrapped, and a paper pallet type package structure wherein the laminated bundle of the planographic printing plates is placed on a paper pallet or the like and wrapped are included.

Hereinafter, with reference to the drawings, a specific example of the above-mentioned planographic printing plate package structure will be described.

As shown in FIG. 1, a planographic printing plate package structure 18 comprises a laminated bundle 12 formed by laminating alternately interleaf papers 14 that is an example of the interleaf paper of the present invention and planographic printing plates 10 and disposing at the upper lower sides a pair of contact cardboard 22 that is included in the interleaf paper of the present invention.

The laminated bundle 12 is wrapped around by an interior paper 16 that is another example of the interleaf paper of the present invention.

Although the number of the planographic printing plates 10 composing the laminated bundle 12 is not particularly limited, with respect to easiness in transportation, storage, and mounting in an automatic plate processor, the number is preferably example 10 to 100. When the laminated bundle 12 is formed of 10 to 100 of the planographic printing plates 10, the planographic printing plates 10 and the protector cardboard 22 are preferably fixed with a fixing means such as an adhesive tape so as not to be displaced with each other. Furthermore, the laminated bundle 12 may be formed of several thousand of the planographic printing plates 10. In the above-mentioned laminated bundle 12, the protector cardboard 22 may be inserted for each 20 to 100 of the planographic printing plates 10. In addition, the protector cardboard 22 can be disposed only on the upper and lower sides of the laminated bundle 12.

The contact cardboard 22 may be eliminated in any of the above-mentioned laminated bundles 12.

Figure 2:
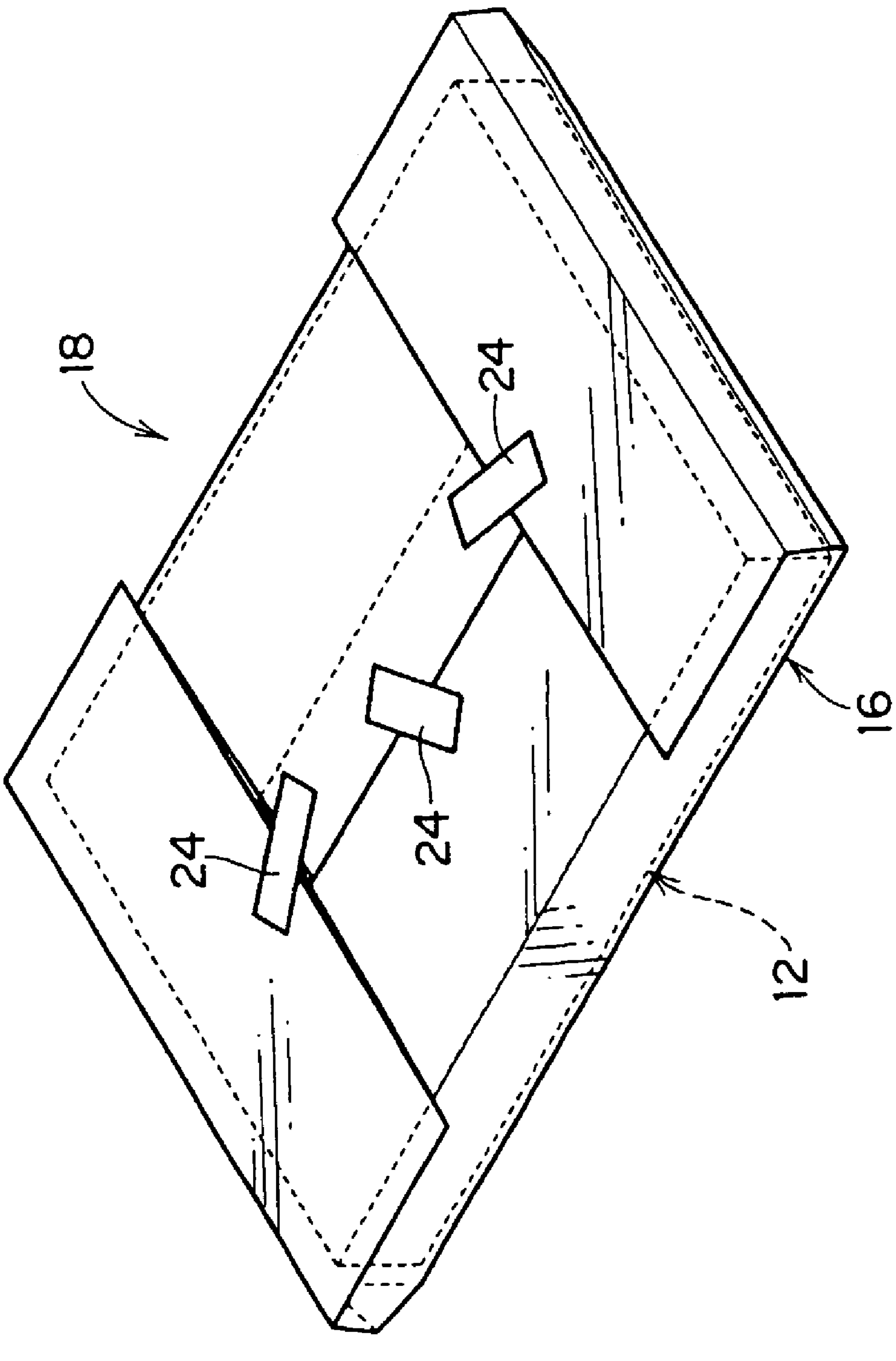
FIG. 2 is a perspective view of the planographic printing plate package structure shown in FIG. 1 showing the state thereof with the laminated bundle packaged with the interior paper.

Thus formed laminated bundles 12 can be wrapped around by the interior paper 16, and then, the folded part of the interior paper 16 is fixed with an adhesive tape 24 as shown in FIG. 2 for preventing unpredictable spreading or removal of the interior paper 16 so as to provide the planographic printing plate package structure 18. By the interior paper, the planographic printing plates 10 are surely protected from the light and moisture.

The planographic printing plate package structure 18 can be packed into an exterior box or placed on a pallet if necessary.

The planographic printing plates 10 are transported to a printing shop in a form of the planographic printing plate package structure 18. At the printing shop, the laminated bundle 12 is taken out from the interior paper wrap and placed in a cassette and mounted to an automatic plate processor. Then, the planographic printing plates 10 are processed.

An example of the operation of the automatic plate processor is shown in FIGS. 3A to 3F.

Figure 3A:
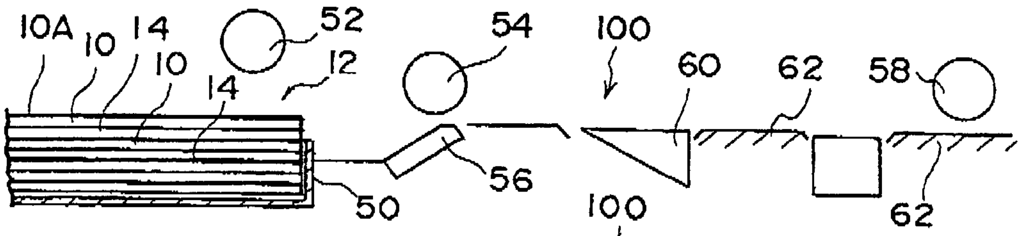
FIGS. 3A to 3F are flow diagrams showing the operation procedure of an automatic plate processor in which the laminated bundle shown in FIG. 1 is mounted.

As shown in FIG. 3A, the protector cardboard 22 and the interleaf paper 14 located on the uppermost part of the laminated bundle 12 shown in FIG. 1 are removed. Then, the laminated bundle 12 is placed in a cassette 50 in a manner that the plate-making layer 10A of the planographic printing plates 10 faces toward the upper side. Then, the cassette 50 storing the laminated bundle 12 is mounted on the automatic plate processor 100.

Figure 3B:
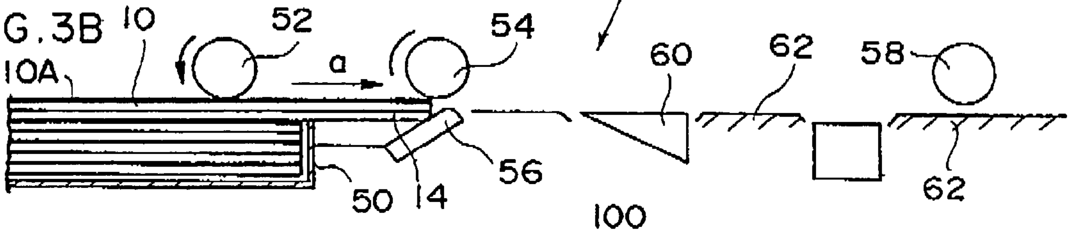

When the cassette 50 is mounted on the automatic plate processor 100, as shown in FIG. 3B, a plate feeding roller 52 for supplying the planographic printing plates 10 in the cassette 50 to the automatic plate processor 100 is lowered toward the cassette 50. When contacting the uppermost planographic printing plate 10 of the laminated bundle 12, the plate feeding roller 52 rotates counter-clockwisely as shown in FIG. 3 so as to carry the planographic printing plate 10 with the interleaf paper 14 therebelow in the direction shown by the arrow 'a' in FIG. 3. When the planographic printing plate 10 and the interleaf paper 14 are carried by the plate feeding roller 52, the coating layer of the planographic printing plate 10 placed just below the interleaf paper is rubbed by the interleaf paper 14. However, since the interleaf paper 14 has a content of Mg, Al and Si of 0.5% by weight or less, the plate-making layer 10A of the planographic printing plate 10 is not broken.

Figure 3C:
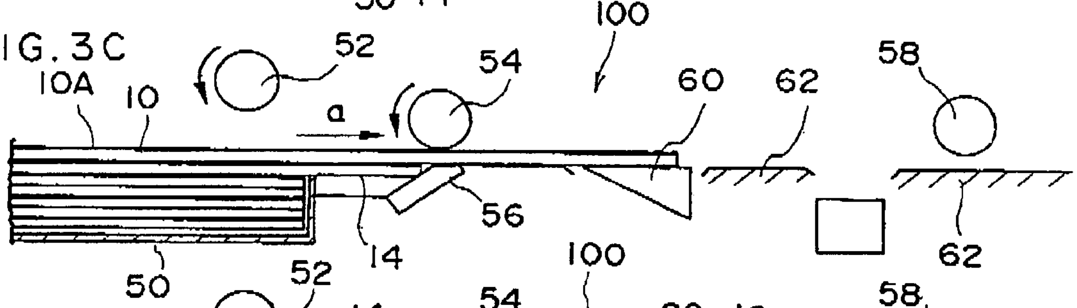

As shown in FIG. 3C, when the planographic printing plate 10, which is transported by the plate feeding roller 52 in the transportation direction 'a', touches a feeding roller 54 that is disposed on the downstream side of the plate feeding roller 52 (hereinafter referred to simply as the "downstream side"), the plate feeding roller 52 is separated from the cassette 50 upwardly to return to the initial location. Then, the planographic printing plate 10 is carried on a transportation base 62 by the feeding roller 54 in the transportation direction 'a'. A stopping pad 56 is provided below the feeding roller 54 so that the interleaf paper 14 transported with the planographic printing plate 10 touch the stopping pad 56 and is stopped by the stopping pad 56.

Figure 3D:
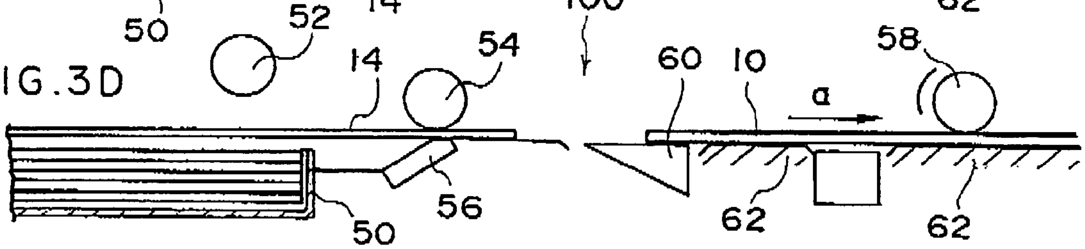

As shown in FIG. 3D, by a second feeding roller 58 disposed in the downstream of the feeding roller 54, the planographic printing plate 10 is transported further on the transportation base 62 formed horizontally toward an exposing drum (not shown) along the transportation direction 'a'.

When the planographic printing plate 10 passes by the feeding roller 54, the upstream end of the interleaf paper 14 is lifted up by the stopping pad 56 and the interleaf paper is transported to the downstream side by the feeding roller 54. When the downstream end part of the interleaf paper 14 passes slightly by the feeding roller 54 and stopped just upstream from a transportation path switching member 60 on the downstream side of the feeding roller 54, the feeding roller 54 is stopped. The transportation path switching member 60 is a plate-like member having a right triangular shaped cross-section with the width narrowed toward the upstream side, is located along the width direction of the transportation path of the interleaf paper 14 and the planographic printing plate 10, and is provided rotatably around the downstream side rim part.

Figure 3E:
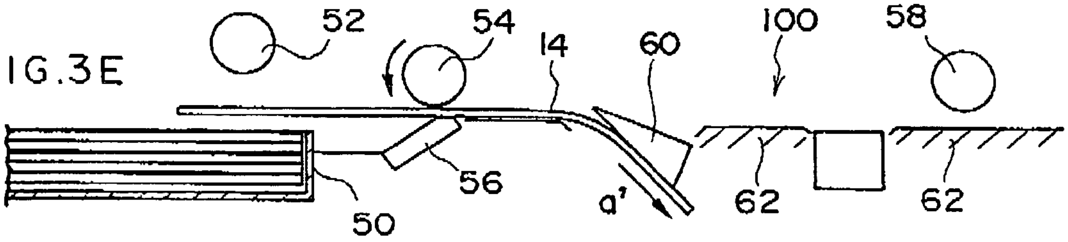

When the feeding roller 54 is stopped, as shown in FIG. 3E, the transportation path switching member 60 is rotated so as to raise the upstream side side rim part. At the same time, the feeding roller 54 is rotated in the counterclockwise direction in FIG. 3E so as to guide the interleaf paper 14 below the transportation base 62 along the transportation direction 'a'.

Figure 3F:
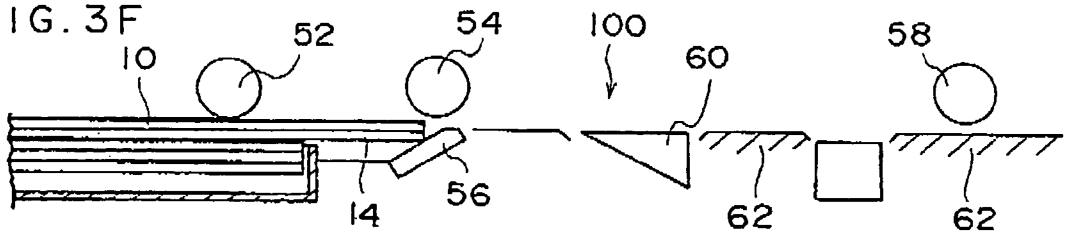

When the interleaf paper 14 is transported by the feeding roller 54, in case when a printing image to be made at the next time is not sent to the automatic plate processor 100, the automatic exposing machine 100 is returned to the state shown in FIG. 3A. On the contrary, in case when a printing image to be made at the next time is sent to the automatic plate processor 100, the plate feeding roller 52 is lowered again toward the cassette 50 so as to transport the next planographic printing plate 10 and interleaf paper 14 to the automatic plate processor 100 as shown in FIG. 3F. Then, when the downstream side tip end part of the planographic printing plate 10 and the interleaf paper 14 is placed in the vicinity of the feeding roller 54 and the stopping pad 56, the plate feeding roller 52 is stopped and the automatic plate processor 100 awaits in this state.

EXAMPLES

1. Examples 1 to 11, Comparative Examples 1 to 9

A bleached kraft pulp was beaten. The beaten kraft pulp was diluted to a 4% by weight concentration in water containing talc in various amounts so as to prepare stocks.

0.4% by weight of a rosin sizing agent, an aluminum sulfate, and a 3.5% by weight of a paper strength additive mainly consisting of a starch were added to the obtained stocks and then, the stocks were made into interleaf papers. The aluminum sulfate was added until the pH values of the above-mentioned stocks reached the value of 5.0.

For each interleaf paper, the element composition, the particle area ratio and the damaging tendency of a planographic printing plate in an automatic plate processor were measured following the below-mentioned procedure.

(Element Composition)

8 sheets of the above-mentioned interleaf paper were superimposed and placed on a boric acid specimen base. The specimen base carrying the interleaf paper sheets was set on a sample holder. The qualitative analysis of the interleaf papers was done at an analysis area of 30 mmϕ by using RIX-3000 produced by Rigaku Co. Ltd. as a fluorescent X-ray element analysis apparatus and the Rh (50 kV, 50 mA) as an X-ray source. The analyzing crystals and the detector tubes used for the qualitative analysis are shown in Table 1.

TABLE 1

| Detected element | C | N, O | F to Mg | Al, Si | P to Cl | K to U |
|---|---|---|---|---|---|---|
| Analyzing crystal | RX-60 | RX-40 | TAP | PET | Ge | LiF |
| Detecting device | F-PC | F-PC | F-PC | F-PC | F-PC | SC |

RX-60, RX-40 artificial built up film
F-PC gas flow type proportional counter tube
SC scintillation counter tube For each of the elements detected in the qualitative analysis, the content (% by weight) was calculated by practicing order analysis in the fundamental parameter method. Results are shown in the Table 2. The fundamental parameter method is a method for calculating a content of an element by calculating theoretical X-ray intensity by a theoretical formula of the fluorescent X-ray intensity using a basic constant (such as a physical constant, an apparatus constant, or the like), and comparing the theoretical X-ray intensity with the measured X-ray intensity. In these examples, the calculation was carried out by using an analysis program provided with the above-mentioned fluorescent X-ray analysis apparatus.

Ash content was measured by heating the above-mentioned interleaf paper in the presence of oxygen at a high temperature into ash, and measuring the weight of the obtained ash. Results are shown in Table 2.

TABLE 2

| | | Elememt composition (% by weight ) | | | | | | | | | Particle area ratio |
|---|---|---|---|---|---|---|---|---|---|---|---|
| | | C | O | Mg | Al | Si | S | Cl | Ca | Ash (wt %) | (%) |
| Example | 1 | 37.2 | 62.2 | 0.05 | 0.28 | 0.10 | 0.05 | 0.10 | 0.02 | 0.45 | 0.05 |
| | 2 | 37.3 | 61.9 | 0.19 | 0.19 | 0.22 | 0.03 | 0.14 | 0.03 | 0.63 | 0.15 |
| | 3 | 37.3 | 62.1 | 0.07 | 0.22 | 0.12 | 0.04 | 0.12 | 0.03 | 0.44 | 0.10 |
| | 4 | 37.1 | 62.0 | 0.17 | 0.23 | 0.21 | 0.04 | 0.21 | 0.04 | 0.65 | 0.20 |
| | 5 | 37.4 | 61.8 | 0.16 | 0.29 | 0.20 | 0.05 | 0.08 | 0.02 | 0.67 | 0.28 |
| | 6 | 37.6 | 62.0 | 0.06 | 0.15 | 0.08 | 0.04 | 0.01 | 0.06 | 0.35 | 0.12 |
| | 7 | 37.6 | 61.9 | 0.10 | 0.16 | 0.12 | 0.04 | 0.02 | 0.06 | 0.44 | 0.13 |
| | 8 | 37.5 | 62.0 | 0.09 | 0.15 | 0.10 | 0.04 | 0.06 | 0.06 | 0.40 | 0.12 |
| | 9 | 37.5 | 62.0 | 0.09 | 0.16 | 0.10 | 0.04 | 0.05 | 0.06 | 0.41 | 0.13 |
| | 10 | 37.7 | 61.8 | 0.09 | 0.17 | 0.11 | 0.04 | 0.03 | 0.06 | 0.43 | 0.13 |
| | 11 | 37.0 | 61.6 | 0.27 | 0.41 | 0.37 | 0.10 | 0.18 | 0.07 | 1.12 | 0.32 |
| Comparative example | 1 | 36.8 | 59.7 | 1.15 | 0.77 | 1.37 | 0.07 | 0.05 | 0.09 | 3.38 | 0.96 |
| | 2 | 37.0 | 59.3 | 1.22 | 0.79 | 1.39 | 0.07 | 0.13 | 0.10 | 3.50 | 1.01 |
| | 3 | 37.3 | 60.7 | 0.75 | 0.35 | 0.81 | 0.03 | 0.02 | 0.04 | 1.95 | 0.55 |
| | 4 | 37.4 | 60.6 | 0.77 | 0.35 | 0.77 | 0.03 | 0.03 | 0.05 | 1.94 | 0.56 |
| | 5 | 37.5 | 60.3 | 0.80 | 0.36 | 0.92 | 0.03 | 0.04 | 0.05 | 2.13 | 0.58 |
| | 6 | 37.1 | 60.8 | 0.62 | 0.41 | 0.69 | 0.10 | 0.21 | 0.07 | 1.79 | 0.52 |
| | 7 | 37.2 | 60.8 | 0.60 | 0.40 | 0.67 | 0.09 | 0.17 | 0.07 | 1.74 | 0.50 |
| | 8 | 37.1 | 60.7 | 0.64 | 0.43 | 0.71 | 0.10 | 0.25 | 0.07 | 1.85 | 0.54 |
| | 9 | 36.9 | 59.5 | 1.25 | 0.81 | 1.42 | 0.07 | 0.02 | 0.02 | 3.48 | 0.98 |

(Particle Area Ratio)

The interleaf papers were attached on a carbon specimen base with a carbon tape and carbon was deposited on the surface of the interleaf paper surface. The interleaf paper with the surface covered by deposited carbon was placed in a chamber of an electron probe micro analyzer and was irradiated by electron beam to obtain a reflecting electron image. Obtained reflected electron image was photographed on a monochromatic instant film. The obtained image was taken into a computer by an image scanner. By using a multipurpose image-processing software and setting a brightness threshold at 180, an area having a higher brightness than the above-mentioned threshold was defined to be the ‘white area’, and the area ratio (%) of the ‘white area’ was calculated. Results are shown in Table 2.

JXA-8800M from JEOL. Co. Ltd. was used as the electron probe micro analyzer. A reflected electron image was photographed in a photography magnification of 40 power in a condition of 20 kV of acceleration voltage and $1\times10^{-8}$ A of irradiation current. The contrast and the brightness of the image were adjusted such that the peak level and the lowest level of the signal wave were 5V and 0.5V, respectively on a waveform monitor monitoring a video signal of the image.

FP-500B45 produced by Fuji Photo Film Co., Ltd. was used as the monochromatic instant film.

JX-250 produced by Sharp Corporation was used as the image scanner. An image of a 10 cm×7 cm area was taken into a computer in 400 dpi resolution and 256 monochromatic gradations.

Win ROOF (version 2.35) produced by Mitani Corp. was used as the multipurpose image-processing software.

(Damaging Tendency of a Planographic Printing Plate in an Automatic Plate Processor)

a. Preparation of Planographic Printing Plates

One side of an aluminum web having 0.3 mm thickness was roughened to form a roughed surface and then, the aluminum web was subjected to anode oxidation treatment to prepare an aluminum substrate.

A photo-polymerizable composition, which contains a monomer having an ethylene unsaturated group, a methacrylic ester polymer, a photo-polymerization initiating agent, and a dye, was coated on the roughened surface of the obtained aluminum substrate in a coating amount of 1.4 $g/m^2$ (after dried) Then the coating was dried at 100° C. for 2 minutes to form a photo-polymerizing layer. Then, an aqueous solution of polyvinyl alcohol having a saponification degree of 99.8% and a polymerization degree of 500 was coated on the above-mentioned photo-polymerizing layer so as to have a coating amount of 2.4 $g/m^2$ (after dried). The polyvinyl alcohol solution layer was dried at 100° C. for 2 minutes to form an oxygen-blocking resin layer. Thus, a planographic printing plate was prepared.

b. Evaluation of Damaging Tendency in an Automatic Plate Processor.

Luxel PLATESETTER P9600CTP laser exposing machine (produced by Fuji Photo Film Co., Ltd.) was used as the automatic plate processor.

First, the plate-making layer of the planographic printing plate prepared in the above-mentioned procedure was covered by the interleaf paper of any of examples 1 to 11 and comparative examples 1 to 9. Then, corona discharge of −8 kV was carried out so that the planographic plate and the interleaf paper closely contacted.

The planographic printing plate with the above-mentioned interleaf paper closely contacted was cut into 1,030 mm×800 mm sheets, and 50 of the sheets were laminated to form a laminated bundle.

The above-mentioned laminated bundle was stored in a cassette. The cassette was set in the Luxel PLATESETTER P9600CTP laser-exposing machine and removal of the interleaf paper and exposure of the planographic printing plate were carried out. After exposure, the planographic printing plate was developed by an LP-850P II automatic developing machine (produced by Fuji Photo Film Co., Ltd.) with a DV-2 developing solution (produced by Fuji Photo Film Co., Ltd.).

The damage-liability of the plate-making layer by the above-mentioned interleaf paper was evaluated by measuring the existence and the number of the flaw by optically observing the plate-making layer surface of the planographic printing plate after removal of the interleaf paper by the Luxel PLATESETTER P9600CTP laser exposing machine. The damage-liability was also evaluated by measuring the existence and the number of void that is an area an aluminum substrate was exposed as a shining spot due to resolving in the developing solution the photo-polymerizing layer that is not photo-polymerized. Results are shown in Table 3.

TABLE 3

| | | Interleaf paper flaw liability | |
|---|---|---|---|
| | | Surface flaw (number/sheet) | Void (number/sheet) |
| Example | 1 | 0 | 0 |
| | 2 | 0 | 0 |
| | 3 | 0 | 0 |
| | 4 | 0 | 0 |
| | 5 | 0 | 0 |
| | 6 | 0 | 0 |
| | 7 | 0 | 0 |
| | 8 | 0 | 0 |
| | 9 | 0 | 0 |
| | 10 | 0 | 0 |
| | 11 | 1 | 1 |
| Comparative example | 1 | 7 | 7 |
| | 2 | 8 | 8 |
| | 3 | 4 | 4 |
| | 4 | 4 | 4 |
| | 5 | 5 | 5 |
| | 6 | 3 | 3 |
| | 7 | 2 | 2 |
| | 8 | 3 | 3 |
| | 9 | 9 | 9 |

As apparently shown in the above-mentioned Table 3, when using interleaf papers of examples 1 to 11 having a content of Mg, Al or Si of 0.5% by weight or less, any surface flaws or voids were not observed or only one surface flaw or void was observed for one sheet.

Particularly, for the interleaf papers of examples 1 to 10 having a particle area ratio of 0.3% or less and an ash content of 1% by weight or less, neither surface flaw nor void were observed.

Thus, is was revealed that the interleaf papers of examples 1 to 11 are preferable for interleaf paper for packaging planographic printing plates.

In contrast, for the interleaf papers of comparative examples 1 to 9, a large number of 2 to 9 flaws were observed on the plate-making surface of the planographic printing plate. Moreover, after development, a large number of void were observed.

2. Examples 12 to 22, Comparative Examples 10 to 18

Interleaf papers of examples 1 to 11 and comparative examples 1 to 9 were lied upon a plate-making layer of the planographic printing plate disclosed in the example 1 of JP-A No. 2001-21691 containing an infrared ray absorbing agent in the plate-making layer and turning alkaline-soluble by heat. Then, corona discharge of −8 kV was carried out so that the interleaf paper and the planographic printing plate contacted closely.

The planographic printing plate with the above-mentioned interleaf paper closely contacted was cut into 1,030 mm×800 mm sheets, and 50 of the sheets were laminated to form a laminated bundle.

The above-mentioned laminated bundle was stored in a cassette. The cassette was set in the Luxel PLATESETTER P9600CTP laser-exposing machine. Then, the interleaf paper was removed from the laminated bundle and the planographic printing plate was carried without exposure and developed in the LP-900H automatic developing machine (produced by Fuji Photo Film Co., Ltd.) with DT-1 developing solution (produced by Fuji Photo Film Co., Ltd.).

The evaluation of the damage-liability of the plate-making layer of the above-mentioned planographic printing plate by the above-mentioned interleaf paper was carried out in the same manner as described in examples 1 to 11 and comparative examples 1 to 9. Results are shown in Table 4.

TABLE 4

| | | Interleaf paper | | Flaw liability of the interleaf paper: Surface flaw (number/sheet) | Flaw liability of the interleaf paper: Void (number/sheet) |
|---|---|---|---|---|---|
| Example | 12 | Example | 1 | 0 | 0 |
| | 13 | | 2 | 0 | 0 |
| | 14 | | 3 | 0 | 0 |
| | 15 | | 4 | 0 | 0 |
| | 16 | | 5 | 0 | 0 |
| | 17 | | 6 | 0 | 0 |
| | 18 | | 7 | 0 | 0 |
| | 19 | | 8 | 0 | 0 |
| | 20 | | 9 | 0 | 0 |
| | 21 | | 10 | 0 | 0 |
| | 22 | | 11 | 1 | 1 |
| Comparative example | 10 | Comparative example | 1 | 8 | 9 |
| | 11 | | 2 | 9 | 10 |
| | 12 | | 3 | 5 | 6 |
| | 13 | | 4 | 4 | 5 |
| | 14 | | 5 | 6 | 6 |
| | 15 | | 6 | 4 | 4 |
| | 16 | | 7 | 3 | 4 |
| | 17 | | 8 | 4 | 5 |
| | 18 | | 9 | 10 | 11 |

As shown in Table 4, for the interleaf papers of examples 12 to 22 having a content of Mg, Al and Si of 0.5% by weight or less, any surface flaws and voids were not observed or only one 1 surface flaw or void was observed for one sheet.

Particularly, for examples 12 to 21 using the interleaf papers of examples 1 to 10 having a particle area ratio of 0.3% or less and an ash content of 1% by weight or less, surface flaws and voids were not observed at all.

From the results, it was learned that the interleaf papers of examples 1 to 11 are preferable also as the interleaf papers for a planographic printing plate of the type used in examples 12 to 22.

On the contrary, in comparative examples 10 to 18, since the same interleaf papers as of comparative examples 1 to 9 were used, a large number of 2 to 9 of surface flaws were observed on the surface of plate-making layer of the planographic printing plate. Moreover, after the development, a large number of voids were observed.

What is claimed is:

1. A method for packaging planographic printing plates, comprising alternately layering planographic printing plates and interleaf papers, the interleaf papers having a Mg content of 0.05 to 0.27% by weight, an Al content of 0.15 to 0.41% by weight, and a Si content of 0.10 to 0.37% by weight.

2. The method for packaging planographic printing plates of claim 1, wherein the interleaf papers further having an ash content of 0.3 to 1.0% by weight are alternately layered with planographic printing plates.

3. The method for packaging planographic printing plates of claim 2, wherein the planographic printing plates having an oxygen-blocking resin layer formed on the surface of the plate-making layer thereof are layered alternately with the interleaf papers.

4. The method for packaging planographic printing plates of claim 2, wherein the interleaf papers further having a particle area ratio of 0.3% or less are alternately layered with the planographic printing plates.

5. The method for packaging planographic printing plates of claim 1, wherein the planographic printing plates having an oxygen-blocking resin layer formed on the surface of the plate-making layer thereof are layered alternately with the interleaf papers.

6. The method for packaging planographic printing plates of claim 1, wherein the planographic printing plates having an oxygen-blocking resin formed on the surface of the plate-making layer thereof and the interleaf papers further having an ash content of 0.3 to 1.0% by weight are layered alternately.

7. The method for packaging planographic printing plates of claim 1, wherein the interleaf papers further having a particle area ratio of 0.3% or less are alternately layered with planographic printing plates.

* * * * *